United States Patent
Zemer et al.

(10) Patent No.: US 10,038,425 B1
(45) Date of Patent: Jul. 31, 2018

(54) SUM OF DIFFERENCES FILTER

(71) Applicant: Apple Inc., Cupertino, CA (US)

(72) Inventors: Tzach Zemer, Haifa (IL); Louie Matar, Haifa (IL); Emmanuel Elder, Mei Ami (IL)

(73) Assignee: Apple Inc., Cupertino, CA (US)

( * ) Notice: Subject to any disclaimer, the term of this patent is extended or adjusted under 35 U.S.C. 154(b) by 318 days.

(21) Appl. No.: 14/980,577

(22) Filed: Dec. 28, 2015

(51) Int. Cl.
 *H03H 17/02* (2006.01)
 *G10L 21/0264* (2013.01)

(52) U.S. Cl.
 CPC ..... *H03H 17/0248* (2013.01); *G10L 21/0264* (2013.01)

(58) Field of Classification Search
 None
 See application file for complete search history.

(56) References Cited

U.S. PATENT DOCUMENTS

| | | | |
|---|---|---|---|
| 7,283,012 B2 | 10/2007 | Lim | |
| 8,462,026 B2 * | 6/2013 | Lagudu | H03K 7/06 341/143 |
| 8,633,763 B2 | 1/2014 | Walker et al. | |
| 2009/0309774 A1 * | 12/2009 | Hamashita | H03M 3/42 341/143 |
| 2013/0300592 A1 | 11/2013 | Snelgrove | |

FOREIGN PATENT DOCUMENTS

TW     355883 B     4/1999

* cited by examiner

*Primary Examiner* — Michael D. Yaary
(74) *Attorney, Agent, or Firm* — Rory D. Rankin; Meyertons, Hood, Kivlin, Kowert & Goetzel, P.C.

(57) ABSTRACT

Systems, apparatuses, and methods for implementing a low power filter. A low power filter may generate a reference sum from a reference vector in order to reduce the number of additions which are needed to filter an input sample vector. The reference sum may be used as the starting point for filtering the input sample vector. Then, each input sample of the input sample vector may be compared to a corresponding reference vector sample. If an input sample is different from the corresponding reference vector sample, a correction value based on the corresponding filter coefficient value may be added or subtracted from the reference sum. After all input samples have been compared to corresponding reference vector values and all correction values applied to the reference sum, the modified reference sum may be the output of the filter.

21 Claims, 9 Drawing Sheets

600 y[n] := the current result
y[n-1] := the previous result
x [] := the current sample vector
x'[] := the sample vector of the reference result
h [] := the filter (coefficients)

```
for ( int i = 0 ; i< T ; i++ ) {
        if x[n-i]==x'[n-i]: continue
        If x[n-i]==1'b1 and x[n-i]≠x'[n-i]: Add +2h[i] to y[n-1]
        If x[n-i]==1'b0 and x[n-i]≠x'[n-i]: Add -2h[i] to y[n-1]
                        }
```

FIG. 6

SUM OF DIFFERENCES FILTER

BACKGROUND

Technical Field

Embodiments described herein relate to the field of signal processing and more particularly, to implementing a filter.

Description of the Related Art

Mobile phone handsets typically include a microphone that converts input sound pressure waves into an output electrical audio signal. The electrical audio signal is sampled and then typically processed and stored by the handset. Other devices also include microphones for capturing sounds, and these devices also include circuitry for performing various types of digital signal processing on the captured sounds.

Pulse density modulation (PDM) is a form of modulation used to represent an analog signal with digital data. In a PDM signal, the relative density of pulses corresponds to the analog signal's amplitude. Various types of signal processing circuitry may be utilized for processing PDM signals. For example, decimators, filters, and/or other types of signal processing logic may be utilized for processing PDM and other digital signals. A decimator may be configured to decimate received input samples from oversampled bitstreams. As used herein, the term "decimate" may be defined as reducing the sampling rate of a signal. Decimation may include, or be accompanied by, filtering to mitigate aliasing distortion. In one embodiment, a decimator may utilize a finite impulse response (FIR) filter to filter the input samples. The equation for a general FIR filter is:

$$y[n] = \sum_{i=0}^{T-1} x[n-i] * h[i]$$

where T is the filter length, n is the discrete time, x[n−i] are the samples, h[i] are the filter coefficients, and y[n] is the result of the filter. With mobile and other devices running on battery power, techniques for reducing power consumption of the various signal processing circuitry (e.g., filters) in the devices are desirable.

SUMMARY

Systems, apparatuses, and methods for implementing a low power filter are contemplated.

In one embodiment, an apparatus may include a digital microphone and signal processing logic. The signal processing logic may include a decimator to decimate and filter the audio samples captured by the digital microphone. In one embodiment, the audio samples may be one-bit pulse density modulation (PDM) samples. The decimator may include a finite impulse response (FIR) filter to filter the audio samples. The FIR filter may be implemented by multiplying filter coefficients by the sample values. When the sample are one-bit values, the FIR filter may be implemented without performing multiplication operations, but instead by adding or subtracting the filter coefficient values together based on the sample values.

In one embodiment, the number of additions performed by the filter may be reduced by starting with a reference sum and then modifying the reference sum if an input sample is different from the corresponding reference sample. The reference sum may be selected so as to minimize the number of additions that are performed. A reference vector may be utilized to generate the reference sum, and any of various types of reference vectors may be utilized, depending on the embodiment. In one embodiment, when the input sample matches the corresponding reference sample from the reference vector, a read from the coefficient memory may be disabled. This may result in additional power savings by reducing the number of memory accesses performed during the filtering of samples.

In one embodiment, multiple reference vectors may be generated and the reference vector with the highest probability of minimizing the number of additions may be utilized. Various types of reference vectors may be utilized, including the previous sample vector, a random vector, an averaged vector, and/or one or more other types of reference vectors. The previous sample vector may be similar to the current sample vector in many cases. A random vector may be used in cases where behavior is unexpected. Multiple reference vectors may be utilized and for each vector, the most suitable reference vector may be selected and utilized as the starting point for generating the filter output. Additionally, for each reference vector, the negative value of the reference vector may also be stored, which limits the number of required additions to be no more than T/2, with 'T' equal to the size of the filter.

These and other features and advantages will become apparent to those of ordinary skill in the art in view of the following detailed descriptions of the approaches presented herein.

BRIEF DESCRIPTION OF THE DRAWINGS

The above and further advantages of the methods and mechanisms may be better understood by referring to the following description in conjunction with the accompanying drawings, in which:

FIG. 6 illustrates one embodiment of a code sample for filtering an input sample vector.

DETAILED DESCRIPTION OF EMBODIMENTS

Figure 1:
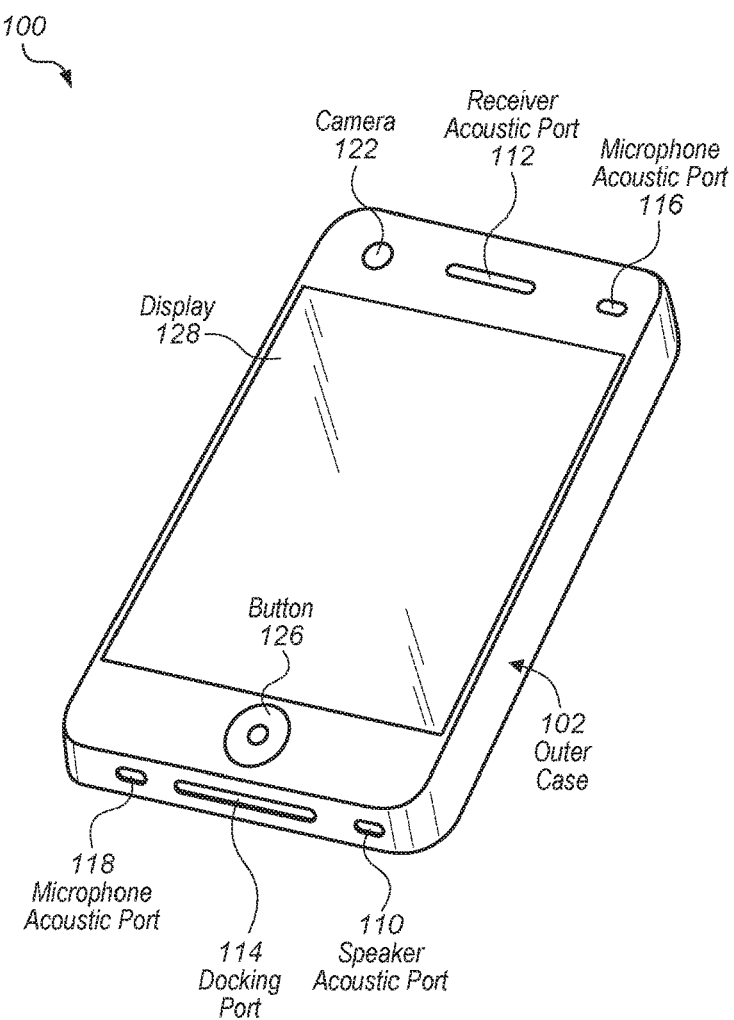
FIG. 1 illustrates one embodiment of a front perspective view of a mobile communications device.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

This specification includes references to "one embodiment". The appearance of the phrase "in one embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A system comprising filter circuitry . . . ." Such a claim does not foreclose the system from including additional components (e.g., a processor, a display, a memory controller).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Referring now to FIG. 1, a front perspective view of a mobile communications device 100 is shown. Device 100 may include an outer housing or case 102 defining or closing off a chamber in which the constituent electronic components of the device 100 are housed. Outer case 102 may include a substantially planar front face and a substantially planar rear face, which are connected by a sidewall portion. The front face may be considered a display side of the device in that it may include a touch screen display 128 that serves as an input and a display output for the device. The touch screen display 128 may be a touch sensor (e.g., those used in a typical touch screen display such as found in an iPhone® device by Apple Inc.). Although the touch screen is illustrated on the front face, if desired, it may be mounted on the back face of device 100, on a side wall of device 100, on a flip-up portion of device 100 that is attached to a main body portion of device 100 by a hinge (for example), or using any other suitable mounting arrangement. The rear face may form a back side of the device, which can be held by the user during operation of device 100. The example of device 100 is merely intended to illustrate one possible embodiment, and it should be understood that other housing styles and/or case structures may be utilized for device 100 in other embodiments.

To further enable its use as a mobile communications device, device 100 may include various acoustic openings or ports at different locations within outer case 102 to allow for transmission of acoustic signals to and from device 100. Representatively, outer case 102 may have formed therein a speaker acoustic port 110, a receiver acoustic port 112, and microphone acoustic ports 116 and 118. Although the acoustic ports are illustrated as separate ports, it is contemplated that any one or more of the illustrated ports may be combined into one port such that, for example, the transducers associated with the illustrated receiver or microphone ports may instead share the same port.

Microphone acoustic ports 116 and 118 may be located on the front face and sidewall of outer case 102 as illustrated. It should be understood that the number and location of microphone acoustic ports may vary in other embodiments. Each of the speaker acoustic port 110, receiver acoustic port 112, and microphone acoustic ports 116 and 118 may be associated with one or more transducers, which may be mounted within outer case 102. In the case of the microphone acoustic ports 116 and 118, the transducer may be an acoustic-to-electric transducer such as a microphone that converts sound into an electrical signal. The microphone may be any type of microphone capable of receiving acoustic energy and converting it into an electrical signal. For example, in one embodiment, the microphone may be a micro-electro-mechanical systems (MEMS) microphone, also referred to as a microphone chip or silicon microphone.

Device 100 may also include camera 122 which may be mounted to outer case 102 to capture still and/or video images of objects of interest. There may also be another camera on the back face of device 100. The outer case 102 may further include other input-output devices such as an earphone port (not shown) to receive an earphone plug, docking port 114 and command button 126. Docking port 114 may sometimes be referred to as a dock connector, 30-pin data port connector, input-output port, or bus connector, and may be used as an input-output port (e.g., when connecting device 100 to a mating dock connected to a computer or other electronic device). Command button 126 may be, for example, a menu button or a home button.

Figure 2:
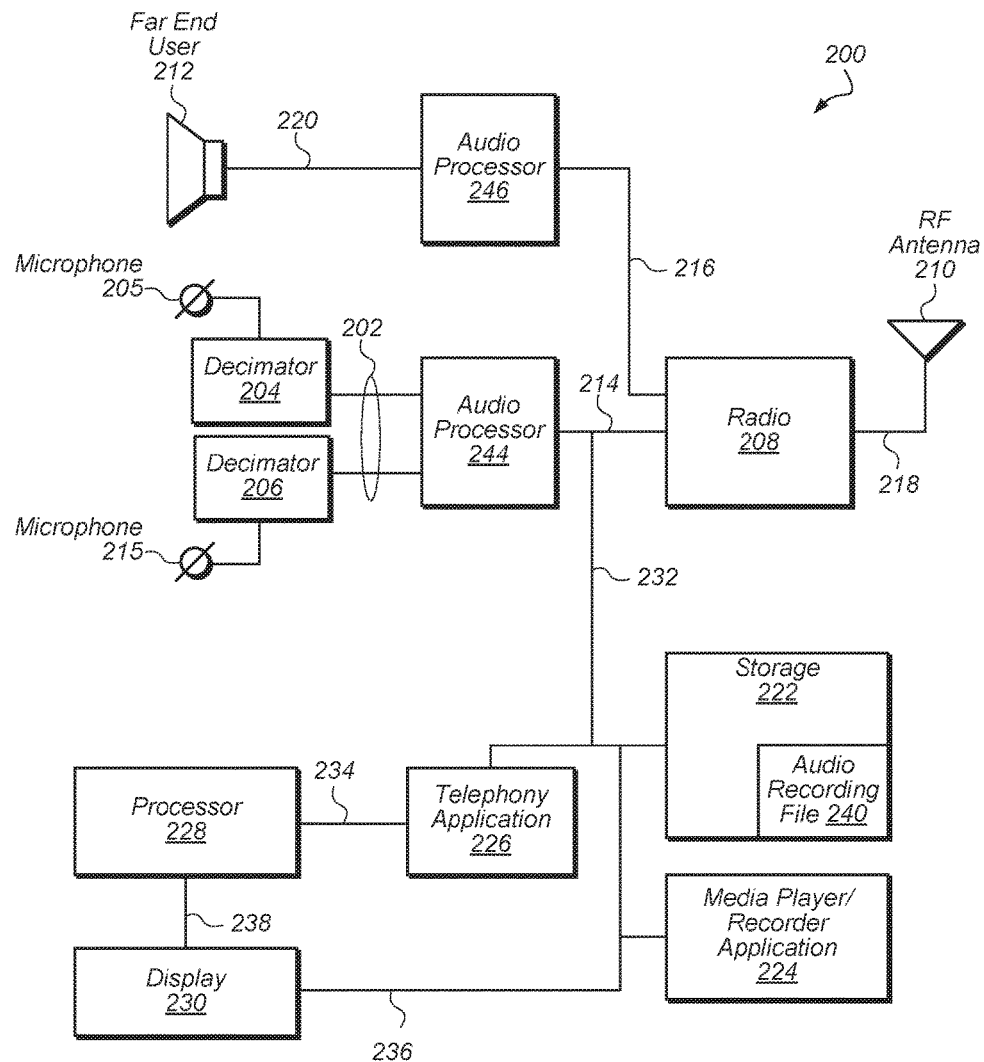
FIG. 2 is a block diagram of one embodiment of an electronic device.

Turning now to FIG. 2, a block diagram of one embodiment of an electronic device 200 is shown. In one embodiment, the circuitry of electronic device 200 shown in FIG. 2 may be included within the outer case 102 of device 100 (of FIG. 1). In various embodiments, device 200 may be a mobile telephone, a mobile telephone with media player capabilities, a handheld computer, a remote control, a game player, a watch, a television, a set-top box, a global positioning system (GPS) device, a laptop computer, a tablet computer, an ultra-portable computer, a combination of such devices, or any other suitable electronic device.

Device 200 may include processor 228 and storage 222, and storage 222 may include one or more different types of storage such as hard disk drive storage, nonvolatile memory (e.g., flash memory or other electrically-programmable-read-only memory), volatile memory (e.g., battery-based static or dynamic random-access-memory), etc. Processor 228 may be used to control the operation of device 200. In various embodiments, processor 228 may be a microprocessor and/or other suitable integrated circuits. In one embodiment, processor 228 and storage 222 may be used to run software on device 200, such as internet browsing applications, voice-over-internet-protocol (VoIP) telephone call applications, email applications, media playback applications, operating system functions, etc. Processor 228 and storage 222 may also be used to implement suitable communications protocols. Communications protocols that may be implemented using processor 228 and storage 222 include internet protocols, wireless local area network protocols (e.g., IEEE 802.11 protocols (or Wi-Fi®)), protocols for other short-range wireless communications links such as the Bluetooth® protocol, protocols for handling 3G or 4G communications services (e.g., using wide band code division multiple access techniques), 2G cellular telephone communications protocols, etc.

In one embodiment, each of microphones 205 and 215 may be located in a microphone acoustic port (e.g., microphone acoustic ports 116 and 118 of FIG. 1) of the outer housing (not shown) of device 200. Each microphone 205 and 215 may be coupled to a corresponding decimator 204 and 206. Each of decimators 204 and 206 may be configured to decimate the input samples received from a respective microphone. As used herein, the term "decimate" may be defined as reducing the sampling rate of a signal while utilizing filtering to mitigate aliasing distortion. In one embodiment, each of decimators 204 and 206 may utilize a finite impulse response (FIR) filter to compute every $N^{th}$ output, wherein 'N' is the decimation factor, and wherein 'N' may be any positive integer greater than one. In other embodiments, decimators 204 and 206 may utilize other types of filters to decimate the received input samples.

The outputs of decimators 204 and 206 may be coupled to audio processor 244 through paths 202. Each of decimators 204 and 206 may include a first-in first-out (FIFO) queue for buffering output samples before conveying the output samples to audio processor 244. Signals from microphones 205 and 215 may be transmitted through uplink audio signal path 214 to radio 208. Radio 208 may transmit the signals via downlink audio signal path 216 to audio processor 246, which is in communication with a far end user device 212 through path 220. Alternatively, radio 208 may transmit the signals to RF antenna 210 through path 218. Audio processor 244 may also be in communication with local storage 222, a media player/recorder application 224 or other telephony applications 226 on the device, through path 232, for local storage and/or recording of the audio signals (e.g., audio recording file 240) as desired. Processor 228 may further be in communication with these local devices via path 234 and also display 230 via path 238 to facilitate processing and display of information corresponding to the audio signals to the user. Display 230 may also be in direct communication with local storage 222 and applications 224 and 226 via path 236 as illustrated.

In one embodiment, each of microphones 205 and 215 may include an analog to digital converter (ADC) for creating digital samples of the captured audio signal. In another embodiment, each of decimators 204 and 206 may include an ADC for sampling the audio signal received from a respective microphone. In one embodiment, the audio signal may be sampled and encoded as a one-bit digital pulse-density modulation (PDM) stream. In this embodiment, for each sample, a value of '1' corresponds to a pulse of positive polarity while a value of '0' corresponds to a pulse of negative polarity. In one embodiment, each decimator 204 and 206 may generate a 16-bit pulse code modulation (PCM) signal output at 16 kHz. In other embodiments, decimator 204 and 206 may generate other types of outputs with other bit-widths and/or at other frequencies.

It is noted that the number of components of device 200 may vary from embodiment to embodiment. There may be more or fewer of each component than the number shown in FIG. 2. It is also noted that device 200 may include many other components not shown in FIG. 2. It should also be understood that the distribution of functionality illustrated in FIG. 2 is not the only possible arrangement of components which may be utilized for device 200. Other devices may include a different arrangement of functionality among the components.

Figure 3:
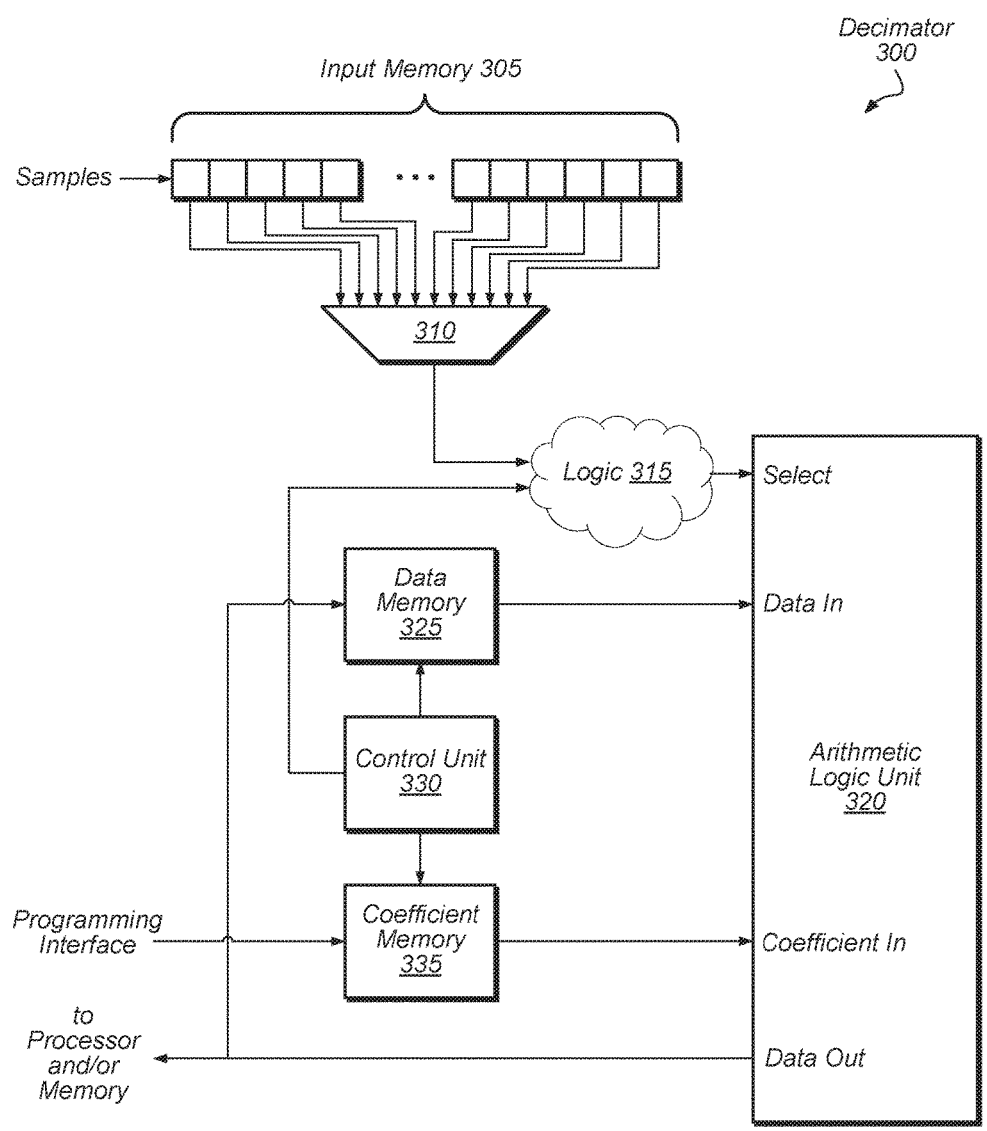
FIG. 3 is a block diagram of one embodiment of a decimator.

Referring now to FIG. 3, a block diagram of one embodiment of a decimator 300 is shown. In one embodiment, the decimators 204 and 206 (of FIG. 2) may include the logic of decimator 300. During decimation, input samples from input memory 305 may be coupled to arithmetic logic unit (ALU) 320 via multiplexer (or mux) 310 and logic 315. Input memory 305 may be any size of shift register chain, buffer, or other memory structure, depending on the embodiment. After a group of input samples are processed by decimator 300, the input samples may be shifted forward in input memory 305 by the decimation factor, and then the next group of input samples may be processed. In one embodiment, the input samples may be generated from an audio signal captured by a microphone. In some embodiments, the input samples may be from an oversampled one-bit PDM stream generated by a digital microphone. The sample frequency (e.g., 1.6 MHz, 800 kHz) may vary according to the embodiment. In another embodiment, the input samples may be captured from other types of signals (e.g., video signal, analog voltage signal).

In one embodiment, ALU 320 may utilize a finite impulse response (FIR) filter for decimating the received samples. ALU 320 may perform lookups of coefficient memory 335 to implement the FIR filter. Coefficient memory 335 is representative of any number and type of memory structures (e.g., lookup tables, hard-coded values) which may be utilized to store filter coefficient values. Any number of bits may be used to represent each coefficient value in coefficient memory 335, depending on the embodiment. In one embodiment, a plurality of the filter coefficient values stored in coefficient memory 335 may be multi-bit values. Coefficient memory 335 may be loaded with coefficient values by a processor via the programming interface in various embodiments. ALU 320 may retrieve filter coefficients from coefficient memory 335 to use when filtering the input samples. In some embodiments, ALU 320 may store the results of an initial decimation stage in data memory 325 and access these results for subsequent decimation stages. Control unit 330 may be configured to generate the select signal used by ALU 320 to manage the decimation process.

In one embodiment, in order for ALU 320 to utilize the sum of differences technique for filtering the input samples, the coefficient values (retrieved from coefficient memory 335) may need to remain the same from one calculation cycle to the next. In the case that the coefficient values are updated, ALU 320 may perform a full calculation of the initial sum in the first cycle after the coefficient values have been updated. Beginning with the second cycle, ALU 320 may start to save calculations by referring to the previous sum or any other reference sum, hence saving power. Since coefficients in a FIR filter are typically updated at a slower rate than the PDM input, coefficients may be steady for several cycles.

It is noted that the number and type of components of decimator 300 may vary from embodiment to embodiment. There may be more or fewer of each component than the number shown in FIG. 3. It is also noted that decimator 300 may include other components not shown in FIG. 3 and/or may omit one or more of the illustrated components. It should also be understood that the distribution of functionality illustrated in FIG. 3 is not the only possible arrangement of components which may be utilized for decimator 300. Other decimators may include a different arrangement of functionality among the components.

Figure 4:
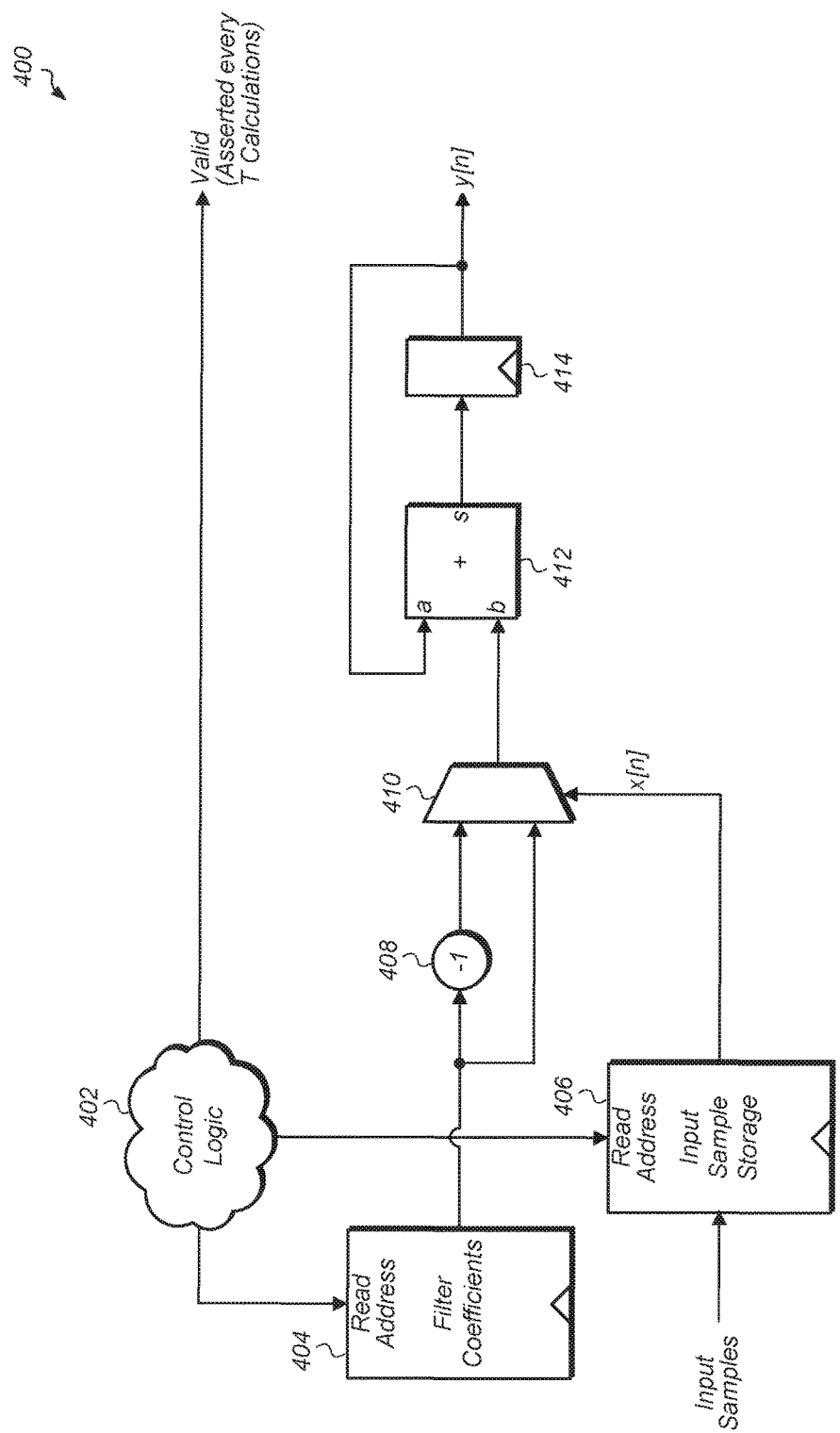
FIG. 4 is a block diagram of one embodiment of a filter.

Turning now to FIG. 4, a block diagram of one embodiment of a filter 400 is shown. Filter 400 is representative of one embodiment of a conventional filter for filtering input samples. In one embodiment, filter 400 may include control logic 402, memories 404 and 406, sign conversion logic 408, multiplexer (or mux) 410, adder 412, and register 414. Control logic 402 may be configured to generate addresses for reading filter coefficients from memory 404 and input samples x[n] from memory 406. In one embodiment, control logic 402 may include a counter (not shown) to increment which values are read out of memories 404 and 406. For example, a first sample may be read out of memory 406 and a first filter coefficient value may be read out of memory 404 in a first cycle, a second sample may be read out of memory 406 and a second filter coefficient value may be read out of memory 404 in a second cycle, a third sample may be read out of memory 406 and a third filter coefficient value may be read out of memory 404 in a third cycle, and so on. When the samples are one-bit values (e.g., PDM samples), each sample value determines whether the corresponding filter coefficient value is added or subtracted from the running total represented by y[n] in FIG. 4.

Memory 404 may store the filter coefficient values which are applied to the input samples stored in memory 406. The filter coefficient value read out of memory 404 may be coupled to mux 410 and sign conversion logic 408, with the output of sign conversion logic 408 coupled to mux 410. The sample value x[n] read out of memory 406 may select whether the filter coefficient value or negative version of the filter coefficient value is coupled through to the output of mux 410. The output of mux 410 may be coupled to the 'b' input of adder 412 with the previous sum coupled back to the 'a' input of adder 412. The sum output 's' of adder 412 may be coupled to the input of register 414, with the output of register 414 labeled as y[n]. When all of the samples of the current group have been processed, control logic 402 may be configured to generate a valid signal, which may be asserted every 'T' calculations, wherein 'T' is the number of taps of the filter.

Figure 5:
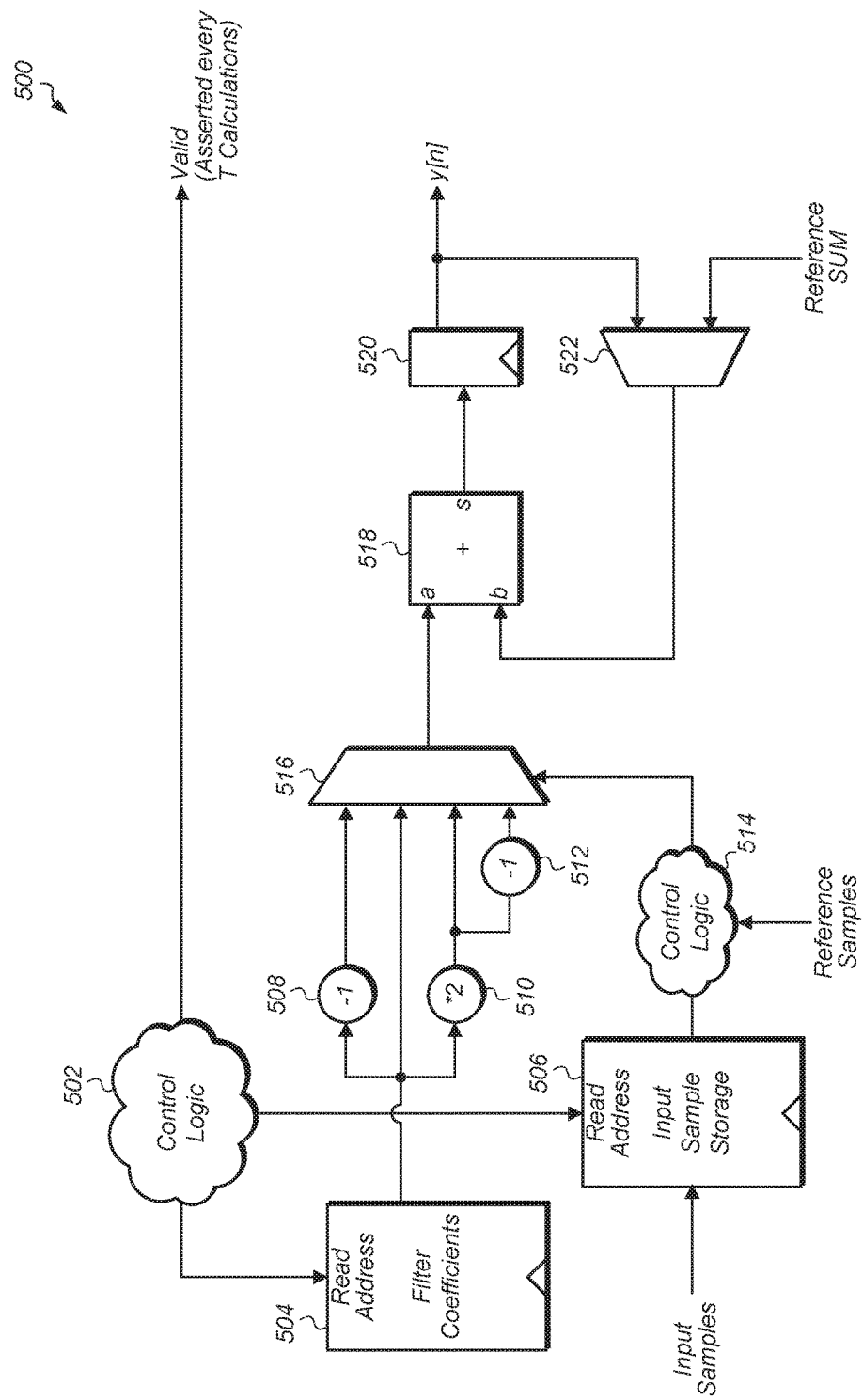
FIG. 5 is a block diagram of another embodiment of a filter.

Referring now to FIG. 5, a block diagram of another embodiment of a filter 500 is shown. In one embodiment, filter 500 may be utilized as part of a decimator (e.g., decimators 204 and 206 of FIG. 2). In other embodiments, filter 500 may be utilized as part of other signal processing circuitry. In one embodiment, filter 500 may operate in a first mode (i.e., using a conventional approach) for filtering an input sample vector or filter 500 may be operate in a second mode (i.e., using a power efficient approach) for filtering the input sample vector. Filter 500 may be configured to switch between the first and second modes on a case by case basis.

On an initial operation for a first input sample vector, filter 500 may filter the first input sample vector using the conventional approach in order to generate a reference sum. The conventional approach involves adding or subtracting the filter coefficients based on the polarity of the input samples to generate a sum which is the filter output. The total number of additions and subtractions in the conventional approach is equal to the total number of input samples being filtered. After the first input sample vector is filtered, the filter output may be stored as a reference sum for use in filtering subsequent input sample vectors using the power efficient approach. The reference sum may be coupled back to adder 518 through mux 522. Then, once a reference sum has been generated, filter 500 may utilize the reference sum as a starting point for filtering the next input sample vector. The reference sum may be coupled back to adder 518, and corrections may be applied to the reference sum based on comparisons between the reference sample values and the new sample values read out of memory 506. The total number of additions and subtractions in the power efficient approach is equal to the number of differences between input samples and corresponding reference samples. This may be significantly less than the total number of additions and subtractions in the conventional approach.

In some embodiments, filter 500 may store or have access to a plurality of stored reference vectors and corresponding reference sums. In these embodiments, filter 500 may select the optimal stored reference vector and corresponding reference sum to use as the starting point for filtering the next input sample vector. The optimal stored reference vector is the reference vector with the least amount of differences from the next input sample vector. In one embodiment, filter 500 may also store the negative values of the reference sum and the reference vector. The negative values of the reference sum and the reference vector may be calculated using two's complement calculations, which may enable a better ratio at reaching the best reference vector while only using a minimal amount of logic.

In one embodiment, control logic 502 may be configured to generate the addresses for reading the current input sample value from memory 506 and the corresponding filter coefficient value from memory 504. Control logic 502 may be implemented using any suitable combination of hardware and/or software. Also, memories 504 and 506 are representative of any type of memory or storage element (e.g., buffer, table). The filter coefficient value read out of memory 504 may be coupled to mux 516 and to sign conversion logic 508 for inverting the sign. The filter coefficient value read out of memory 504 may also be doubled by logic 510, which may shift the filter coefficient value one bit left to effectively double the filter coefficient value. The doubled filter coefficient value may be coupled to mux 516 and to sign conversion logic 512 for inverting the sign. The outputs of sign conversion logic 508 and 512 may also be coupled to mux 516.

In one embodiment, control logic 514 may be configured to compare a given input sample to the corresponding reference sample and to select which input to couple through mux 516 to adder 518. Control logic 514 may be implemented using any suitable combination of hardware and/or software. The output of adder 518 may be coupled to register 520, with the output of register 520 the result y[n] of the filter. The result y[n] may be asserted as valid after 'T' calculations, with 'T' the number of taps of the filter, and with the value of 'T' varying from embodiment to embodiment.

Control logic 514 may move through the input sample vector sample by sample and compare each sample to a corresponding reference sample. If the given input sample is equal to the reference sample, the reference sum may remain the same (i.e., no correction is applied to the reference sum) and then control logic 514 may move on to the next sample. Additionally, if the given input sample is equal to the reference sample, the read to memory 504 for the filter coefficient may not be performed to conserve power. The more often an input sample is equal to the corresponding reference sample, the less often corrections and memory reads will be performed, resulting in a substantial reduction in the filter's power consumption.

In one embodiment, control logic 514 may be configured to track the number of additions performed for each input sample vector which is filtered by filter 500. If the number of additions performed for a given sample vector is above a threshold, then control logic 514 may select, from a plurality of reference vectors, a first reference vector for filtering the next input sample vector. In one embodiment, the first reference vector may be a randomly generated vector. In other embodiments, the first reference vector may be any of various other types of vectors (e.g., inverse of the previous reference vector). If the number of additions for the given sample vector is below the threshold, then the control unit may select a second reference vector for filtering the next input sample vector. It may be assumed for the purposes of this embodiment that the second reference vector is different from the first reference vector. In one embodiment, the second reference vector may be the previous input sample vector. In other embodiments, the second reference vector may be any of various other types of vectors (e.g., the previous reference vector).

It should be understood that the block diagram of filter 500 shown in FIG. 5 is merely one example of a filter which may be implemented to perform the techniques described herein for reducing the power consumption of the filter. In other embodiments, filter 500 may be structured differently, include one or more components not shown, and/or omit one or more components shown. For example, control logic 502 and control logic 514 may be combined into a single control unit in another embodiment. Generally speaking, any suitable combination of hardware and/or software elements may be utilized to implement filter 500. For example, filter 500 may have separate elements or blocks to perform comparisons, apply corrections, and so on, where the elements or blocks include circuitry to perform the given functions. These and other embodiments are possible and are contemplated.

Turning now to FIG. 6, one embodiment of a code sample 600 for filtering an input sample vector is shown. Code sample 600 includes the array y[n] which represents the current filter result and the array y[n−1] which represents the previous filter result. The array x[ ] represents the current sample vector, and the array x'[ ] represents the sample vector which was used to generate the reference result. The array h[ ] represents the filter coefficient values which are used to implement the filter.

In one embodiment, a for loop may be implemented in code sample 600 with the integer T initialized to 0 and the for loop continuing for 'T' iterations, where 'T' is equal to the number of taps (i.e., the total number of filter coefficients) of the filter. For each iteration of the loop, the element 'n−i' of the current sample vector x[ ] may be compared to the corresponding element 'n−i' of the reference vector x'[ ]. If the elements are equal, then the reference sum may remain unchanged, and a read to the coefficient memory may be prevented. If the elements are unequal, then double the corresponding filter coefficient h[i] may be added to the reference sum y[n−1] if x[n−i] is greater than x'[n−i], or double the corresponding filter coefficient h[i] may be subtracted from the reference sum y[n−1] if x[n−i] is less than x'[n−i]. The for loop may iterate through 'T' input samples until a final result y[n] is generated, which is the output of the filter.

Code sample 600 represents one possible implementation of code for filtering an input sample vector using the techniques described herein. It should be understood that other implementations may utilize a different code sequence with other instructions to implement similar techniques for reducing the number of additions performed by the filter.

Figure 7:
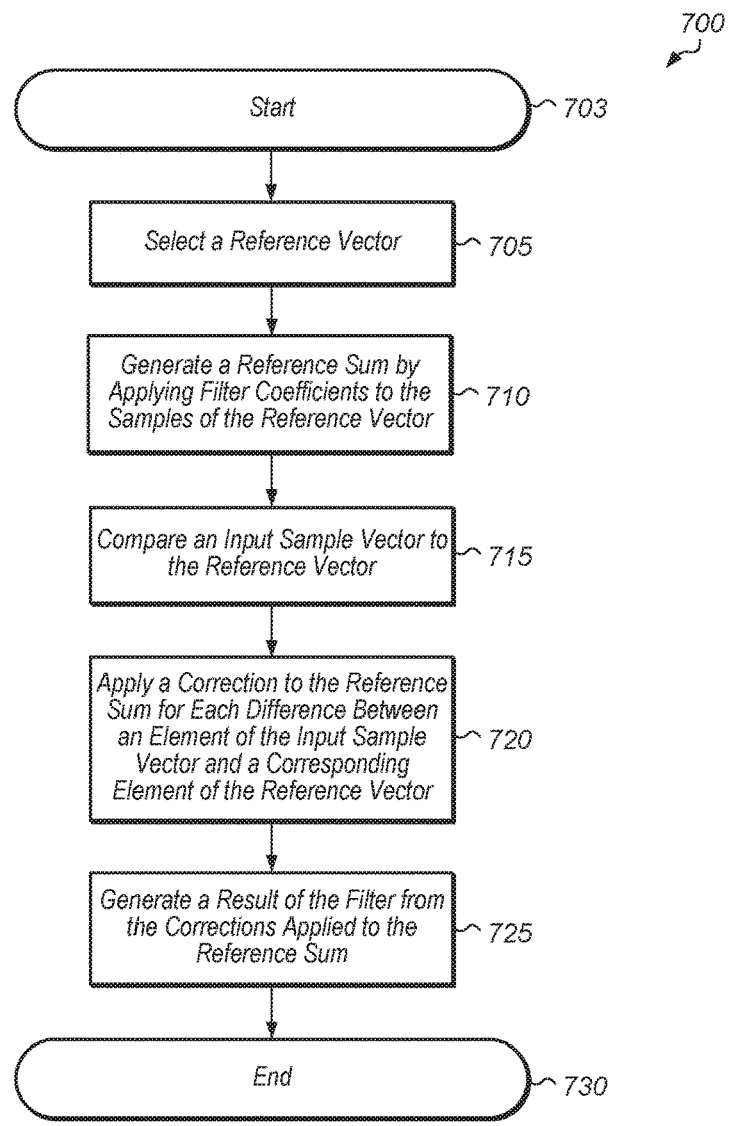
FIG. 7 is a generalized flow diagram illustrating one embodiment of a method for implementing a low power filter.

Referring now to FIG. 7, one embodiment of a method 700 for implementing a low power filter is shown. In the exemplary embodiment, the method is shown beginning at block 703 and ending at block 730. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems and/or apparatuses described herein may be configured to implement method 700.

A reference vector may be selected (block 705). In one embodiment, a reference vector may be selected from a plurality of possible reference vectors for use in the filtering process. One example of a method for selecting a reference vector is described in further detail below in the discussion associated with method 900 of FIG. 9. It may be assumed for the purposes of this discussion that the reference vector is the same length (i.e., has the same number of samples) as the sample vector. In one embodiment, the reference vector which is the most similar to the sample vector may be selected in block 710. In some embodiments, a prediction may be made as to which reference vector is most likely to have the fewest number of differences from the sample vector. As used herein, the term "vector" may be defined as a one-dimensional array of two or more elements. In other words, a reference vector refers to a plurality of samples. In one embodiment, the samples may be PDM samples. In other embodiments, the filter may include only a single reference vector, and in these embodiments, the single reference vector may be selected by default in block 705.

Next, a reference sum may be generated from the reference vector by applying filter coefficients to the samples of the reference vector (block 710). Next, an input sample vector may be compared to the reference vector (block 715). Corrections may be applied to the reference sum for each difference between an element of the input sample vector and a corresponding element of the reference vector (block 720). An example of one embodiment of block 720 is described in further detail below in regard to method 800 of FIG. 8. For example, in one embodiment, each sample of the input sample vector may be compared to a corresponding sample of the reference vector. If the sample from the input sample vector is the same as the corresponding sample of the reference vector, then no correction may be applied to the reference sum. However, if the sample from the input sample vector is not the same as the corresponding sample of the reference vector, then a correction may be applied to the reference sum. In one embodiment, the correction may be adding or subtracting double a corresponding filter coefficient to the reference sum, with addition being performed if the element of the input sample vector is greater than the corresponding element of the reference vector, and with subtraction being performed if the element of the input sample vector is less than the corresponding element of the reference vector. After block 720, the result of the filter may be generated from the corrections applied to the reference sum (block 725). After block 725, method 700 may end.

Figure 8:
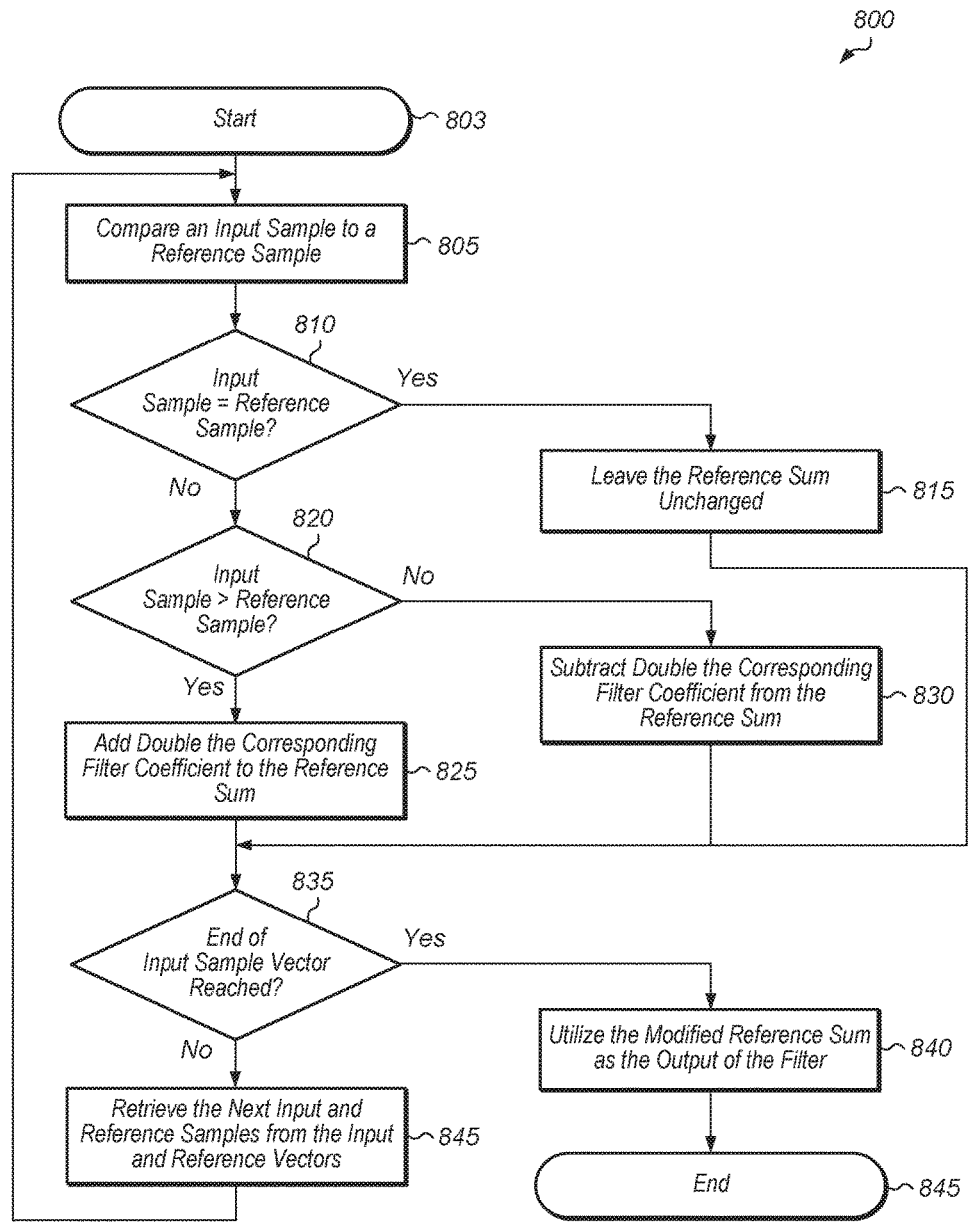
FIG. 8 is a generalized flow diagram illustrating one embodiment of a method for comparing an input vector to a reference vector.

Turning now to FIG. 8, one embodiment of a method 800 for comparing an input vector to a reference vector is shown beginning with block 803 and ending with block 845. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems and/or apparatuses described herein may be configured to implement method 800.

An input sample may be compared to a reference sample (block 805). If the input sample is equal to the reference sample (conditional block 810, "yes" leg), then a reference sum may remain unchanged (block 815). Also, if the input sample is equal to the reference sample, a read to the coefficient memory may be prevented from occurring. If the input sample is not equal to the reference sample (conditional block 810, "no" leg), then it may be determined if the input sample is greater than the reference sample (conditional block 820).

If the input sample is greater than the reference sample (conditional block 820, "yes" leg), then double the corresponding filter coefficient may be added to the reference sum (block 825). If the input sample is greater than the reference sample (conditional block 820, "no" leg), then double the corresponding filter coefficient may be subtracted from the reference sum (block 830). Alternatively, block 830 may be implemented by adding double the negative version of the corresponding filter coefficient to the reference sum. Then, after blocks 815, 825, and 830, it may be determined if the end of the input sample vector has been reached (conditional block 835). If the end of the input sample vector has been reached (conditional block 835, "yes" leg), then the modified reference sum may be utilized as the output of the filter (block 840). If the end of the input sample vector has not been reached (conditional block 835, "no" leg), then the next input sample from the input sample vector and the next reference sample from the reference vector may be retrieved (block 845), and then method 800 may return to block 805 and compare the next input sample to the next reference sample.

Figure 9:
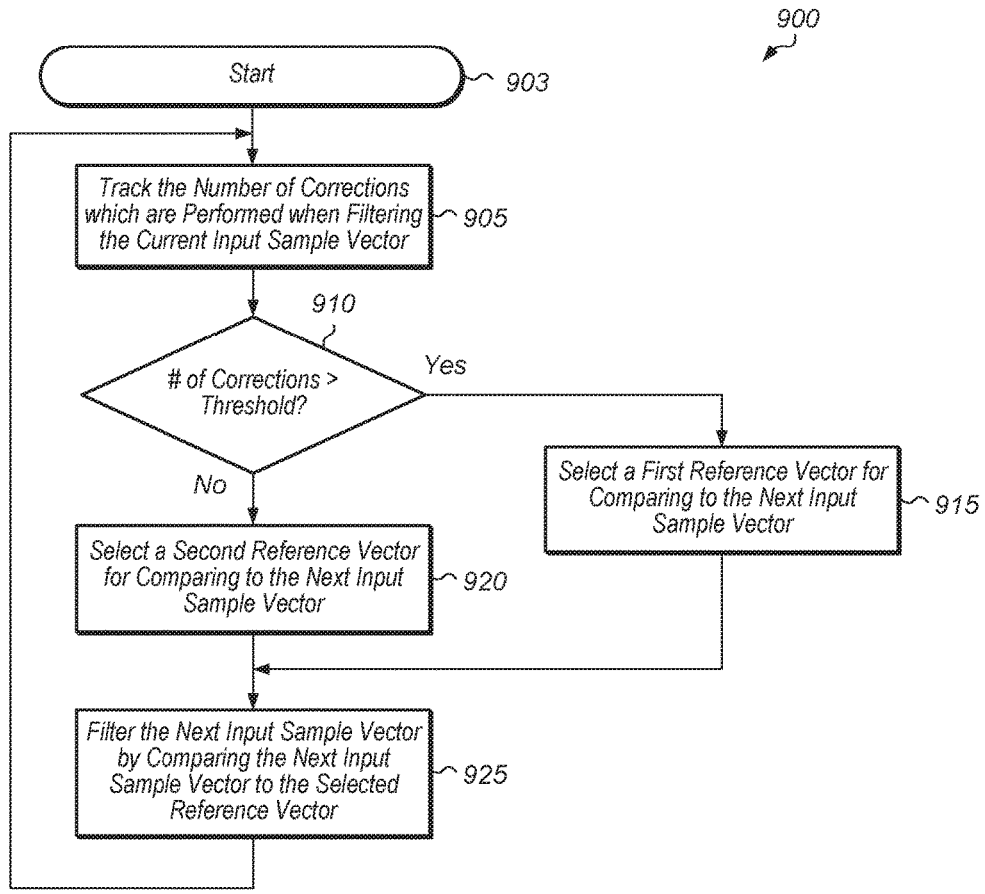
FIG. 9 is a generalized flow diagram illustrating one embodiment of a method for selecting a reference vector.

Referring now to FIG. 9, one embodiment of a method 900 for selecting a reference vector is shown beginning with block 903. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems and/or apparatuses described herein may be configured to implement method 900.

Control logic of a filter may track the number of corrections which are performed when filtering the current input sample vector (block 905). In one embodiment, the filter may be a finite impulse response (FIR) filter. If the number of corrections is above a threshold (conditional block 910, "yes" leg), then the control unit may select a first reference vector for comparing to the next input sample vector (block 915). The first reference vector may also be used to generate a first reference sum which is used as the starting point for filtering the next input sample vector. In one embodiment, the first reference vector may be a randomly generated vector. In other embodiments, the first reference vector may be any of various other types of vectors (e.g., inverse of the previous reference vector). If the number of corrections is below the threshold (conditional block 910, "no" leg), then the control unit may select a second reference vector for comparing to the next input sample vector (block 920). It may be assumed for the purposes of this embodiment that the second reference vector is different from the first reference vector. In one embodiment, the second reference vector may be the current input sample vector. In other embodiments, the second reference vector may be any of various other types of vectors (e.g., the most recently used reference vector). After blocks 915 and 920, the next input sample vector may be filtered by comparing it with the selected reference vector (block 925). Then, after block 925, method 900 may return to block 905 with the control logic tracking the number of corrections performed while filtering the input sample vector.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus configured to filter an input sample vector, wherein the apparatus comprises:
   comparison circuitry configured to compare each input sample of the input sample vector to a corresponding element of a reference vector;
   correction circuitry configured to apply a correction to a reference sum responsive to determining the input sample does not equal the corresponding element of the reference vector, wherein applying the correction to the reference sum comprises:
   adding a multiple of a corresponding filter coefficient value to the reference sum if the input sample is greater than the corresponding element of the reference vector; and
   subtracting the multiple of the corresponding filter coefficient value from the reference sum if the input sample is less than the corresponding element of the reference vector; and
   circuitry configured to utilize the reference sum, after applying any corrections, as a filter output.

2. The apparatus as recited in claim 1, further comprising circuitry configured to utilize the reference vector to generate the reference sum, wherein the reference vector comprises a plurality of reference samples.

3. The apparatus as recited in claim 1, further comprising circuitry configured to:
   track a number of corrections which are performed when filtering a first input sample vector;
   utilize a first reference vector for generating a first reference sum responsive to determining the number of corrections is greater than a threshold; and
   utilize a second reference vector for generating a second reference sum responsive to determining the number of corrections is greater than the threshold, wherein the second reference vector is different from the first reference vector.

4. The apparatus as recited in claim 3, wherein the first reference vector is a randomly generated vector, and wherein the second reference vector is a most recently used reference vector.

5. The apparatus as recited in claim 1, wherein the multiple of the corresponding filter coefficient value is double the corresponding filter coefficient value.

6. The apparatus as recited in claim 1, further comprising circuitry configured to:
   store a plurality of reference vectors;
   generate and store a plurality of reference sums for the plurality of reference vectors; and
   select, from the plurality of reference vectors, an optimal reference vector for comparing to the input sample vector, wherein the optimal reference vector has a lowest number of differences from the input sample vector.

7. The apparatus as recited in claim 1, further comprising circuitry configured to:
   perform a read of a corresponding filter coefficient value from memory only if the input sample is not equal to the corresponding element of the reference vector; and
   prevent the corresponding filter coefficient value from being read from memory if the input sample is equal to the corresponding element of the reference vector.

8. A method for filtering an input sample vector, wherein the method comprising:
   comparing each input sample of the input sample vector to a corresponding element of a reference vector;
   applying a correction to a reference sum responsive to determining the input sample does not equal the corresponding element of the reference vector wherein applying the correction to the reference sum comprises:
   adding a multiple of a corresponding filter coefficient value to the reference sum if the input sample is greater than the corresponding element of the reference vector; and
   subtracting the multiple of the corresponding filter coefficient value from the reference sum if the input sample is less than the corresponding element of the reference vector; and
   utilizing the reference sum, after applying any corrections, as a filter output.

9. The method as recited in claim 8, further comprising utilizing the reference vector to generate the reference sum, wherein the reference vector comprises a plurality of reference samples.

10. The method as recited in claim 8, further comprising:
    tracking a number of corrections which are performed when filtering a first input sample vector;
    utilizing a first reference vector for generating a first reference sum responsive to determining the number of corrections is greater than a threshold; and
    utilizing a second reference vector for generating a second reference sum responsive to determining the number of corrections is greater than the threshold, wherein the second reference vector is different from the first reference vector.

11. The method as recited in claim 10, wherein the first reference vector is a randomly generated vector, and wherein the second reference vector is a most recently used reference vector.

12. The method as recited in claim 8, wherein the multiple of the corresponding filter coefficient value is double the corresponding filter coefficient value.

13. The method as recited in claim 8, further comprising:
    storing a plurality of reference vectors;
    generating and storing a plurality of reference sums for the plurality of reference vectors; and
    selecting, from the plurality of reference vectors, an optimal reference vector for comparing to the input sample vector, wherein the optimal reference vector has a lowest number of differences from the input sample vector.

14. The method as recited in claim 8, further comprising:
    performing a read of a corresponding filter coefficient value from memory only if the input sample is not equal to the corresponding element of the reference vector; and
    preventing the corresponding filter coefficient value from being read from memory if the input sample is equal to the corresponding element of the reference vector.

15. A computing system comprising:
    a memory; and
    filter circuitry configured to:
    compare each input sample of the input sample vector to a corresponding element of a reference vector;
    apply a correction to a reference sum responsive to determining the input sample does not equal the corresponding element of the reference vector, wherein applying the correction to the reference sum comprises:
    adding a multiple of a corresponding filter coefficient value to the reference sum if the input sample is greater than the corresponding element of the reference vector; and
    subtracting the multiple of the corresponding filter coefficient value from the reference sum if the input sample is less than the corresponding element of the reference vector; and
    utilize the reference sum, after applying any corrections, as a filter output.

16. The computing system as recited in claim 15, wherein the filter circuitry is further configured to utilize the reference vector to generate the reference sum, wherein the reference vector comprises a plurality of reference samples.

17. The computing system as recited in claim 15, wherein the filter circuitry is further configured to:
    track a number of corrections which are performed when filtering a first input sample vector;
    utilize a first reference vector for generating a first reference sum responsive to determining the number of corrections is greater than a threshold; and
    utilize a second reference vector for generating a second reference sum responsive to determining the number of corrections is greater than the threshold, wherein the second reference vector is different from the first reference vector.

18. The computing system as recited in claim 17, wherein the first reference vector is a randomly generated vector, and wherein the second reference vector is a most recently used reference vector.

19. The computing system as recited in claim 15, wherein the multiple of the corresponding filter coefficient value is double the corresponding filter coefficient value.

20. The computing system as recited in claim 15, wherein the filter circuitry is further configured to:
    store a plurality of reference vectors;
    generate and store a plurality of reference sums for the plurality of reference vectors; and
    select, from the plurality of reference vectors, an optimal reference vector for comparing to the input sample vector, wherein the optimal reference vector has a lowest number of differences from the input sample vector.

21. An apparatus configured to filter an input sample vector, wherein the apparatus comprises:
    comparison circuitry configured to compare each input sample of the input sample vector to a corresponding element of a reference vector;
    correction circuitry configured to apply a correction to a reference sum responsive to determining the input sample does not equal the corresponding element of the reference vector; and
    circuitry configured to utilize the reference sum, after applying any corrections, as a filter output; and
    circuitry configured to:
        perform a read of a corresponding filter coefficient value from memory only if the input sample is not equal to the corresponding element of the reference vector; and
        prevent the corresponding filter coefficient value from being read from memory if the input sample is equal to the corresponding element of the reference vector.

* * * * *